US008129712B2

(12) United States Patent
Nishikawa et al.

(10) Patent No.: US 8,129,712 B2
(45) Date of Patent: Mar. 6, 2012

(54) ORGANIC EL PANEL

(75) Inventors: Ryuji Nishikawa, Gifu (JP); Tetsuji Omura, Ogaki (JP); Masaya Nakai, Gifu (JP)

(73) Assignee: Sanyo Electric Co., Ltd. (JP)

( * ) Notice: Subject to any disclaimer, the term of this patent is extended or adjusted under 35 U.S.C. 154(b) by 839 days.

(21) Appl. No.: 11/362,965

(22) Filed: Feb. 27, 2006

(65) Prior Publication Data

US 2006/0192220 A1     Aug. 31, 2006

(30) Foreign Application Priority Data

Feb. 28, 2005   (JP) .................................. 2005-53894

(51) Int. Cl.
*H01L 35/24* (2006.01)
(52) U.S. Cl. ................. 257/40; 257/72; 257/59
(58) Field of Classification Search .............. 257/72, 257/40, 59
See application file for complete search history.

(56) References Cited

U.S. PATENT DOCUMENTS

| | | | |
|---|---|---|---|
| 5,405,710 A | 4/1995 | Dodabalapur et al. | |
| 5,554,911 A | 9/1996 | Nakayama et al. | |
| 5,757,126 A | 5/1998 | Harvey, III et al. | |
| 5,936,347 A | 8/1999 | Isaka et al. | |
| 6,080,030 A | 6/2000 | Isaka et al. | |
| 6,111,270 A | 8/2000 | Xu et al. | |
| 6,445,005 B1 | 9/2002 | Yamazaki et al. | |
| 6,505,901 B1 | 1/2003 | Fukuda | |
| 6,639,250 B1 | 10/2003 | Shimoda et al. | |
| 6,670,772 B1 | 12/2003 | Arnold et al. | |
| 6,710,541 B2 | 3/2004 | He et al. | |
| 6,737,800 B1 | 5/2004 | Winters et al. | |
| 6,747,618 B2 * | 6/2004 | Arnold et al. | 345/77 |
| 6,812,637 B2 | 11/2004 | Cok et al. | |
| 6,841,803 B2 | 1/2005 | Aizawa et al. | |
| 6,906,457 B2 | 6/2005 | Song et al. | |
| 7,023,013 B2 * | 4/2006 | Ricks et al. | 257/40 |
| 7,102,282 B1 | 9/2006 | Yamada et al. | |
| 7,218,049 B2 | 5/2007 | Yamada et al. | |
| 7,710,025 B2 | 5/2010 | Yamada et al. | |
| 2002/0113548 A1 | 8/2002 | Silvernail | |
| 2003/0146696 A1 | 8/2003 | Park et al. | |
| 2003/0160564 A1 | 8/2003 | Park et al. | |

(Continued)

FOREIGN PATENT DOCUMENTS

JP    8-8061    1/1996

(Continued)

OTHER PUBLICATIONS

Notice of Grounds for Rejections for Korean Patent Application No. 10-2005-52411 with English translation mailed Oct. 20, 2006.

(Continued)

*Primary Examiner* — Samuel Gebremariam
(74) *Attorney, Agent, or Firm* — Cantor Colburn LLP

(57) ABSTRACT

Each pixel includes a region where a lower reflection film is not present. In each pixel, there is a region where a microcavity structure is formed between a counter electrode and a lower reflection film and another region where the microcavity structure is not formed. The regions differentiated in cavity length can differently enhance the peak wavelength so as to improve the viewing angle dependence. Furthermore, in each of R, G, and B light emitting pixels, the area ratio of a region where the microcavity structure is present and another region where the microcavity structure is not present can be adjusted so as to eliminate the differences caused by the microcavity structure.

5 Claims, 10 Drawing Sheets

U.S. PATENT DOCUMENTS

| | | |
|---|---|---|
| 2004/0051447 A1 | 3/2004 | Okinaka et al. |
| 2005/0040756 A1 | 2/2005 | Winters et al. |
| 2005/0067945 A1 | 3/2005 | Nishikawa et al. |
| 2005/0067954 A1 | 3/2005 | Nishikawa et al. |
| 2005/0073228 A1 | 4/2005 | Tyan et al. |
| 2005/0088085 A1 | 4/2005 | Nishikawa et al. |
| 2005/0099113 A1 | 5/2005 | Yamada |
| 2005/0280364 A1 | 12/2005 | Omura et al. |
| 2008/0024402 A1 | 1/2008 | Nishikawa et al. |
| 2008/0272690 A1 | 11/2008 | Kuma et al. |

FOREIGN PATENT DOCUMENTS

| | | |
|---|---|---|
| JP | 9-45477 A | 2/1997 |
| JP | 2005-302313 A | 10/2005 |
| JP | 2005-322435 A | 11/2005 |
| JP | 2006-32327 A | 2/2006 |
| WO | 00-76010 A1 | 12/2000 |
| WO | 01/39554 A1 | 5/2001 |
| WO | 2005/107327 A1 | 11/2005 |

OTHER PUBLICATIONS

Office Action for U.S. Appl. No. 10/953,667 mailed Sep. 28, 2007.
Office Action for U.S. Appl. No. 10/952,645 mailed Sep. 21, 2007.
Japanese Patent Laid-Open Publication No. Hei 6-275381 and its English abstract.
"Study of Organic EL Materials and Devices from Basis to Frontier" from Molecular Electronics and Bioelectronics, Dec. 16-17, 1993, and its excerpt English translation.
Office Action dated Jan. 6, 2006, for related U.S. Appl. No. 10/954,092.
Japanese Patent Publication No. JP2003187975 with its English abstract.
European application No. EP 0615401 A1 dated Sep. 20, 1993.
Office Action for U.S. Appl. No. 10/952,645 mailed Feb. 25, 2008.
Partial Translation of Section 3 of Technical Document of Molecular Electronics and Bioelectronics discussed in Third Seminar given in (1993), entitled "elements Having Optical Cavity Structure."
Office Action for U.S. Appl. No. 10/953,667 mailed Mar. 26, 2007.
Office Action for U.S. Appl. No. 10/952,645 mailed Apr. 2, 2007.
Office action for related U.S. Appl. No. 10/954,092.
Office Action for corresponding Korean Patent Application No. 10-2004-77132, mailed Apr. 26, 2006, with its excerpt English translation.
Korean Patent Laid-Open Publication No. 2003-2182, dated Jan. 8, 2003, with its English Abstract and complete English translation.
Japanese Patent Laid-Open Publication No. Sho 63-148597, dated Jun. 21, 1988, with its full English translation.
Japanese Patent Laid-Open Publication No. 2001-217072, dated Aug. 10, 2001, with its English Abstract.
Office Action for corresponding Korean Patent Application No. 10-2004-76414, mailed Apr. 25, 2006, with its excerpt English translation.
Office Action for corresponding Korean Patent Application No. 10-2004-76977, mailed Apr. 25, 2006, with its excerpt English translation.
Office Action dated Aug. 3, 2006 for related U.S. Appl. No. 10/953,667.
Office Action for U.S. Appl. No. 10/953,667 mailed May 15, 2008.
Office Action for U.S. Appl. No. 11/156,961 dated Sep. 19, 2008.

* cited by examiner

ORGANIC EL PANEL

CROSS-REFERENCE TO RELATED APPLICATIONS

The entire disclosure of Japanese Patent Application No. 2005-53894 filed Feb. 28, 2005 including specification, claims, drawings, and abstract is incorporated herein by reference.

BACKGROUND OF THE INVENTION

1. Field of the Invention

The present invention relates to an organic EL panel including plural pixels each having an organic EL element, and more particularly to an organic EL panel having, in each pixel, a micro-resonator (i.e., microcavity) capable of enhancing the light of a specific wavelength.

2. Description of the Related Art

A flat panel display (FPD) is a prospective display device having a thin and compact structure. Some liquid crystal displays, which are a type of FPD, are practically used in various devices. Furthermore, there are light emitting devices (e.g., display devices or light sources) including self-luminous type electro-luminescence elements (hereinafter, referred to as "EL elements"). In particular, organic EL display devices (i.e., organic EL panels) can produce a variety of luminescent colors depending on organic compound materials contained in the organic EL elements.

The organic EL display devices are the self-luminous type and accordingly different from liquid crystal displays or other display devices that control the transmissivity of the light emitted from a back light. Thus, the organic EL display devices have excellent efficiency in the use of light. Namely, the organic EL display devices can realize highly effective and bright emission of the light.

However, the organic EL element includes an organic layer that tends to deteriorate depending on conditions of use. In particular, to increase the brightness of the light, the injection current to the organic layer can be increased. In such a case, the organic layer deteriorates significantly.

As discussed in Japanese Patent Application Laid-open NO. hei06-275381, or in "Element Employing an Optical Resonator Structure" by Takahiro NAKAYAMA and Atsushi SUMIDA, the Japan Society of Applied physics, Molecular Electronics and Bioelectronics division, 1993, third meeting, p 135-p 143, it is known that an EL display device employing a micro-resonator (i.e., microcavity) can enhance the light of a specific wavelength.

However, the viewing angle dependence of a display color is not negligible when the microcavity is used, because an optical length of the microcavity when seen from the vertical direction is different from an optical length seen from an oblique direction. Accordingly, the wavelength of the enhanced light varies depending on the viewing angle.

It is therefore necessary to reduce or eliminate the viewing angle dependence caused by the microcavity.

SUMMARY OF THE INVENTION

According to the present invention, one pixel includes a region where no microcavity structure is present or includes a region where the thickness of a semi-transmissive film is differentiated, in order to improve (i.e., reduce or eliminate) the viewing angle dependence. Furthermore, the cavity length varies depending on the color (resonant wavelength). When the cavity length is long, the viewing angle dependence is large. Namely, the viewing angle dependence is different in each color.

Hence, in the present invention, the microcavity effect of enhancing the light of a specific wavelength can be changed or adjusted in accordance with the color of the light emitted from a pixel. The viewing angle dependence can be effectively improved.

BRIEF DESCRIPTION OF THE DRAWINGS

The accompanying drawings, which are incorporated in and constitute a part of the specification, illustrate an embodiment of the invention and, together with the description, serve to explain the principles of the invention, in which.

DESCRIPTION OF PREFERRED EMBODIMENTS

Embodiments of the present invention will be described below with reference to the drawings.

First Embodiment

Figure 1:
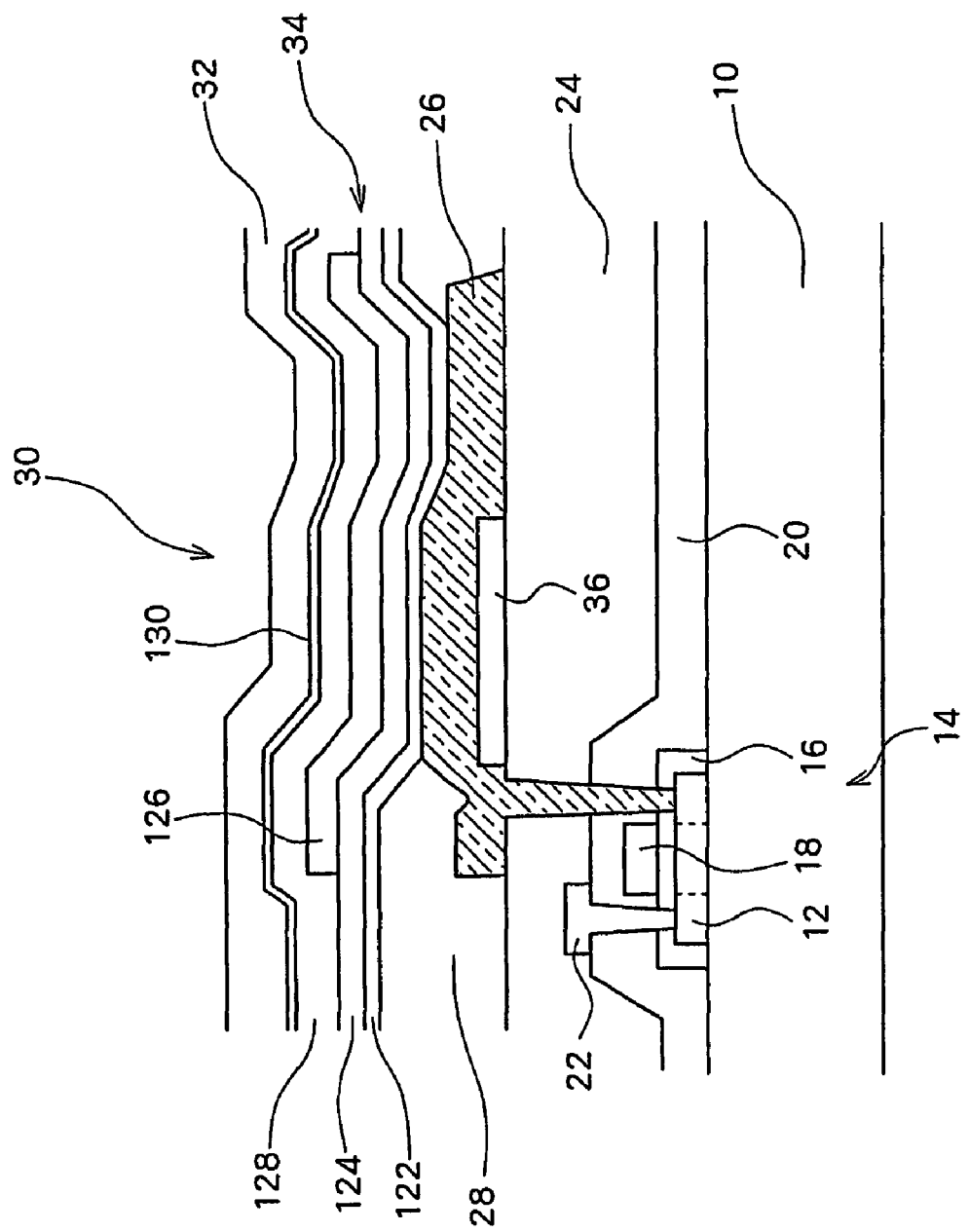
FIG. 1 is a cross-sectional view showing an essential structure of a pixel in accordance with a first embodiment of the present invention.

FIG. 1 is a cross-sectional view schematically showing the arrangement of a microcavity structure in a pixel of a display panel in accordance with a first embodiment of the present invention.

A semiconductor layer 12, formed at a predetermined place of a glass substrate 10, can constitute a TFT, electrodes, or wiring. According to the example shown in FIG. 1, the semiconductor layer 12 constitutes source, channel, and drain regions of a drive TFT 14. A gate insulating film 16 covers the semiconductor layer 12 of the drive TFT 14. A gate electrode 18, formed on the gate insulating film 16, is positioned above the channel region of the semiconductor layer 12.

An interlayer insulating film 20, formed on the gate electrode 18 and the gate insulating film 16, entirely covers the upper surface of the glass substrate 10. A source electrode 22, extending across the interlayer insulating film 20, contacts the source region of the drive TFT 14. A first flattening film 24 covers the source electrode 22 and the interlayer insulating film 20. A transparent electrode 26, formed on the first flattening film 24, has a size corresponding to a display area of the pixel. The transparent electrode 26 is connected to the drain region of the drive TFT 14 via a contact hole.

A second flattening film 28 conceals the peripheral portion of the transparent electrode 26. A portion above the transparent electrode 26 constitutes an organic EL element 30.

The organic EL element 30 has a multilayered structure including an organic layer (luminous element layer) 34, positioned between the transparent electrode 26 and a counter electrode 32. The organic layer 34 contains organic compounds, such as organic luminous materials. According to this arrangement, injection of holes from an anode and injection of electrons from a cathode are available for the organic layer 34. The injected holes and electrons can recombine with each other in the organic layer 34 while releasing the recombination energy. The recombination energy can put organic luminous materials into the excited state. The organic layer 34 generates the light when the excited materials return to the ground state.

The transparent electrode 26 can be constructed from a conductive metal-oxide material, such as ITO (Indium Tin Oxide) or IZO (Indium Zinc Oxide). The counter electrode 32, made of Al or its alloy, can function as an upper reflection film. A lower reflection film 36, partly provided beneath the transparent electrode 26, can constitute a micro-resonator (i.e., microcavity) structure together with the upper reflection film (i.e., the counter electrode 32). More specifically, the lower reflection film 36 occupies a part of the entire surface of a light emitting region. The light generated from the organic layer 34 can advance straight in a downward direction in a region where the lower reflection film 36 is not provided.

According to the example shown in FIG. 1, the light generated from the organic layer 34 can penetrate the substrate 10 via the transparent electrode 26 and can exit out of the organic EL element 30. In this respect, the example shown in FIG. 1 is a so-called bottom emission-type display device. The lower reflection film 36 is a semi-transmissive type, and accordingly the light generated from the organic layer 34 can partly penetrate the lower reflection film 36. The lower reflection film 36 can be any one of Ag, Au, Pt, and Al films, or their alloy films. The lower reflection film 36 can be formed thin enough to allow the light to penetrate, or can be configured into a mesh, a lattice, or any other pattern having apertures.

Furthermore, the lower reflection film 36 can be constituted by multilayered dielectric films consisting of two types of dielectric members which are different from each other in refractivity and are alternately laminated. The optical film thickness of each dielectric film layer is, for example, ¼ of a target reflection wavelength or its integer multiple.

The organic layer 34, including a light emitting layer containing at least organic luminous molecules, can be configured into a single layer, double layers, triple layers, quadruple layers, or any other multilayered structure depending on the material (s).

According to the example shown in FIG. 1, a hole injection layer 122, a hole transporting layer 124, a light emitting layer 126, an electron transporting layer 128, and an electron injection layer 130 are successively laminated on the transparent electrode 26, for example, by a vacuum vapor deposition method. The transparent electrode 26 can function as an anode. Similar to the organic layer 34, the counter electrode 32 can be formed on the electron injection layer 130 by a vacuum vapor deposition method. The counter electrode 32 can function as a cathode. The electron injection layer 130 can be regarded as constituting part of the counter electrode 32.

The microcavity structure of the present embodiment is in an internal space sandwiched by the transparent electrode 26 and the counter electrode 32 which oppose each other via the organic layer 34, namely in an interlayer space between the lower reflection film 36 located beneath the transparent electrode 26 and the upper reflection film (i.e., the counter electrode 32). An optical length (optical distance) L of the microcavity structure can be expressed by the formula $L = \rho n_i d_i$ - - - (1), i.e., by the sum of products of a refractivity $n_i$ and a thickness $d_i$ of respective layers existing between the lower reflection film 36 and the counter electrode 32 (i.e., the upper reflection film). The relationship between the optical length L and a light emitting wavelength λ can be set as shown by a later-described formula (3), to emit the light having a selectively enhanced wavelength λ.

As described above, enhancing the light of a specific wavelength by the use of a microcavity structure must solve the problems of the viewing angle dependence. Hence, according to the present embodiment, each pixel has a region where the lower reflection film 36 is not present in the light emitting region. The light generated from the organic layer 34 can penetrate the region where the lower reflection film 36 is not present.

The light penetrating the region where the lower reflection film 36 does not exist has a relatively wide peak, because the light is not subjected to the microcavity effect of enhancing the light of a specific wavelength. In other words, the viewing angle dependence can be reduced. As a result, the present embodiment can bring about the effects of adequately enhancing the light of a specific wavelength emitted from a pixel while improving the viewing angle dependence.

In general, a full-color organic EL panel includes three types of pixels, i.e., R, G, and B light emitting pixels. The R, G, and B light emitting pixels have predetermined optical lengths Lr, Lg, and Lb corresponding to R, G, and B wavelengths λr, λg, and λb. According to this example, the lower reflection film 36 and the counter electrode 32 are made of metallic materials. The phase shift, occurring when the light reflects on these films, can be expressed by φ in the later-described formula (3).

Figure 2:
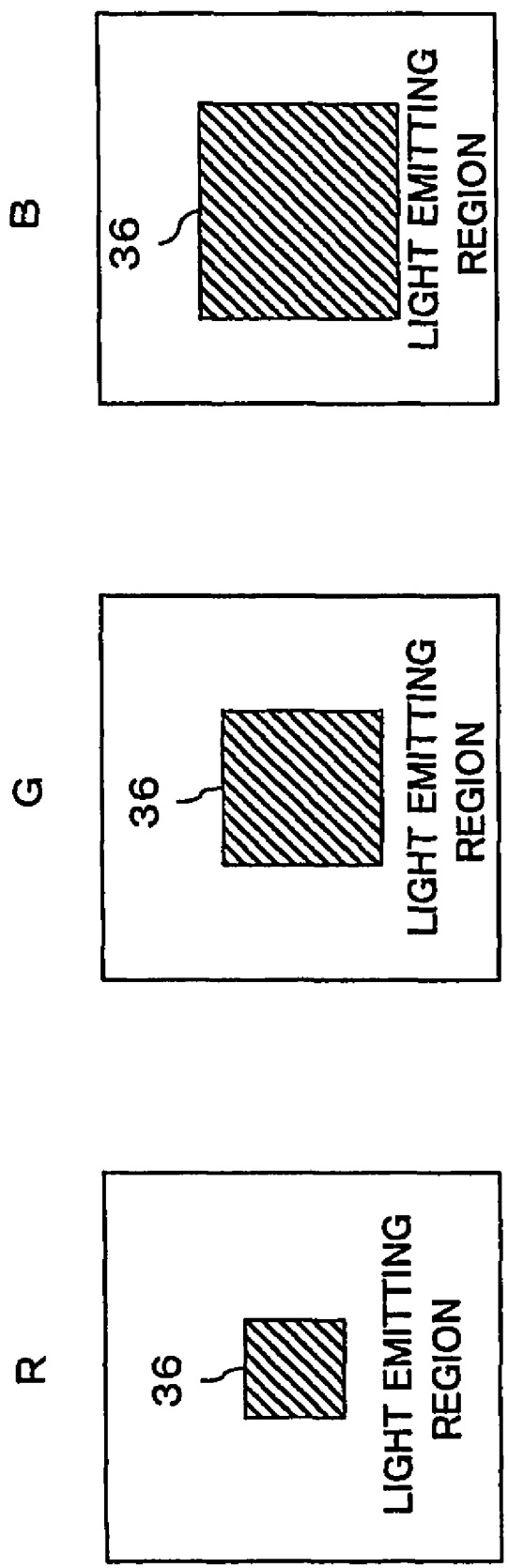
FIG. 2 is a view schematically showing the formation of a lower reflection film differentiated in each of R, G, and B light emitting pixels.

The present embodiment is characterized in that an area ratio of a region where the lower reflection film 36 is present and another region where the lower reflection film 36 is not present is differentiated depending on the color of the light emitted from each pixel (i.e., depending on the difference of RGB colors of each pixel). More specifically, as schematically shown in FIG. 2, the percentage of the lower reflection film 36 relative to the entire light emitting region is smallest in the R light emitting pixel, medium in the G light emitting pixel, and largest in the B light emitting pixel. In general, a change of the resonant wavelength depending on the viewing angle, i.e., the viewing angle dependence, becomes larger at long wavelengths.

Figure 5:
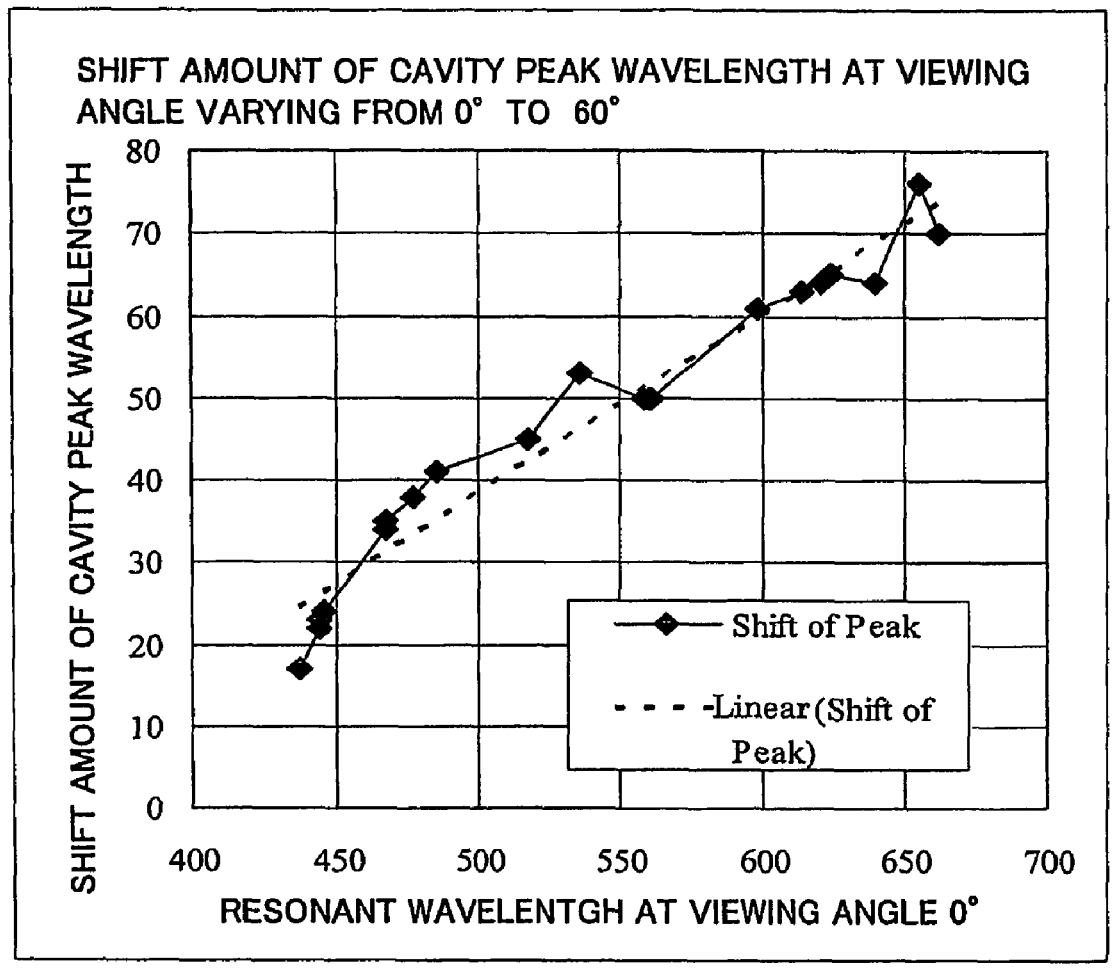
FIG. 5 is a view showing a relationship between the wavelength of the light and a peak wavelength shift amount at a viewing angle 60°.

FIG. 5 shows a relationship between the resonant wavelength and the viewing angle dependence. The abscissa represents resonant wavelengths at the front side (i.e., at a viewing angle 0°). The ordinate represents a difference between the resonant wavelength at a viewing angle 60° and the resonant wavelength at the front side. As shown in the drawing, the viewing angle dependence of the R light emitting pixel is highest.

Accordingly, as described in the present embodiment, setting the area percentage of the lower reflection film 36 relative to the entire light emitting region to be smallest in the R light emitting pixel, medium in the G light emitting pixel, and largest in the B light emitting pixel can bring about substantially the same effects for each of the R, G, and B light emitting pixels in enhancing the light of a specific wavelength as well as in improving (i.e., reducing or eliminating) the viewing angle dependence.

In the example shown in FIG. 2, the lower reflection film 36 is located at the center of the pixel (i.e., at the center of the light emitting region). However, the lower reflection film 36 can be disposed at an offset position as shown in FIG. 1. Furthermore, the lower reflection film 36 can consist of plural discrete regions or can be formed into any other configuration.

Second Embodiment

Figure 3:
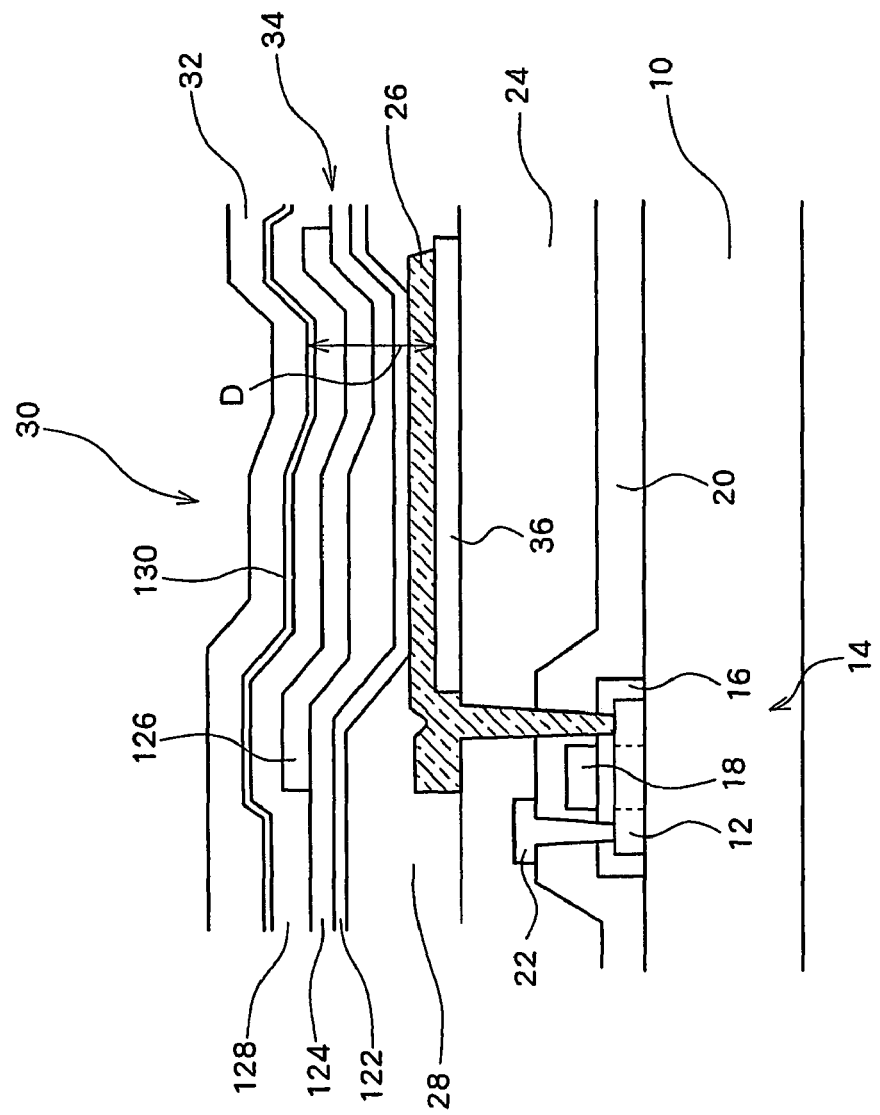
FIG. 3 is a cross-sectional view showing an essential structure of a pixel in accordance with a second embodiment of the present invention.

FIG. 3 shows an essential structure of a pixel in accordance with a second embodiment of the present invention. The lower reflection film 36 of the second embodiment covers the entire surface of the light emitting region. The organic layer 34 is partly thickened in a predetermined region of the light emitting region. According to the example of the second embodiment, the hole transporting layer 124 is relatively thick in a left part of the light emitting region and relatively thin in a right part of the light emitting region.

The characteristics of the microcavity structure can be determined according to the distance (i.e., cavity length) between the upper reflection film and the lower reflection film. Accordingly, in the present embodiment, the organic layer 34 having a partly changed thickness can provide two regions in the light emitting layer which are differentiated in cavity length. Thus, the wavelength of the light enhanced by the microcavity structure can be locally differentiated.

Figure 4:
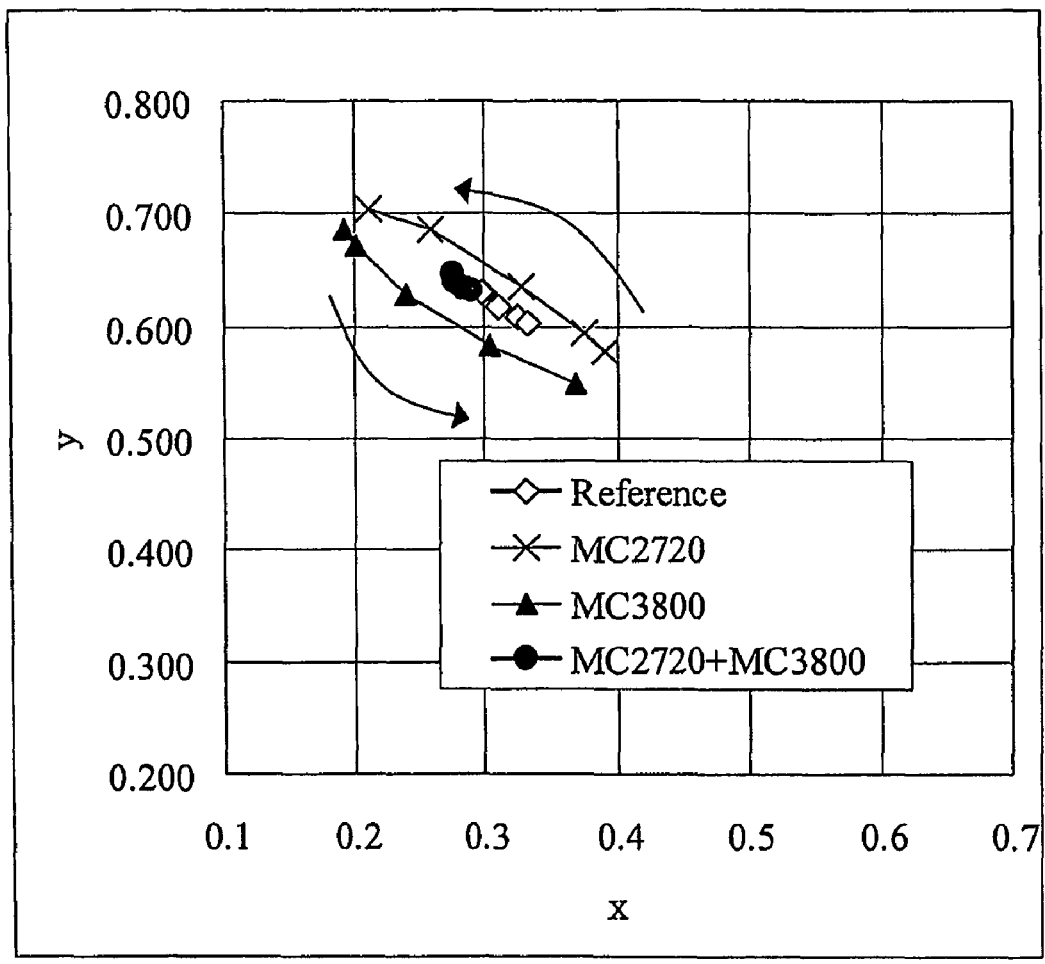
FIG. 4 is a view showing the viewing angle dependence in various examples.

FIG. 4 shows the viewing angle dependence in an EL element emitting the green light in the following cases.
  (i) MC2720: the cavity length D of the microcavity structure is 2720 Angstrom (hereinafter referred to as "A");
  (ii) MC3800: the cavity length D is 3800 A;
  (iii) Reference: no microcavity; and
  (iv) MC2720+MC3800: the regions of MC2720 and MC3800A are distributed with an area ratio=1:1.

FIG. 4 is a chromaticity diagram (Yxy) in a CIE display system. The cavity length D is an actual film thickness (i.e. a sum of film thicknesses) between the reflection film and the semi-transmissive film, which is necessary to obtain the above-described optical length L required to resonate the light of a predetermined wavelength, and can be expressed by the formula $$D = \Sigma d_i \quad (2).$$

The MC2720 EL element (indicated by a line of -x-x-x-) has a resonant wavelength of 570 nm at the viewing angle 0° as a chromaticity shown at a lower right portion (x=0.39, y=0.58). The resonant wavelength shifts toward the short wavelength side when the viewing angle increases (namely, shifts in the direction advancing to the upper left in the drawing). Furthermore, the MC2720 EL element has a resonant wavelength of 520 nm at the viewing angle 60° as the green light having higher color purity at an upper left portion (x=0.21, y=0.71) in the drawing.

On the other hand, the MC3800 EL element (indicated by a line of -▲-▲-▲-) has a resonant wavelength of 510 nm at the viewing angle 0° (i.e., at the front side of the microcavity structure) as the green light having higher color purity at an upper left portion (x=0.19, y=0.69). The resonant wavelength shifts towards the short wavelength side when the viewing angle increases (namely, shifts in the direction advancing to the lower right), and reaches the lower right portion (y=0.37, y=0.55) at the viewing angle 60°.

The light emission spectrum obtained from the organic luminous materials used in the element has a peak at green and has smaller blue components. Even when the resonant wavelength shifts in accordance with increasing viewing angle, the luminous intensity of the element decreases because their resonant wavelength components are small in the original light emission spectrum. Thus, the semi-transmissive green light is obtained.

In the case of Reference EL element (indicated by a line of -□-□-□-), the shift range is approximately 0.30 to approximately 0.33 in the value of x and approximately 0.60 to approximately 0.63 in the value of y. Accordingly, the viewing angle dependence is relatively small.

In the case of MC2720+MC3800 EL element (i.e., the present embodiment), the viewing angle dependence becomes smaller compared with the cases using only one type of cavity condition. More specifically, the MC3800A EL element can realize high color purity at the viewing angle 0° and the MC2700A EL element can realize high color purity at the viewing angle 60°. Thus, the color purity can be maintained at a higher level at any viewing angle.

Accordingly, the element including plural regions mutually differentiated in the cavity length has the chromaticity shifting in the small range of x=approximately 0.27 to approximately 0.29 and y=approximately 0.63 to approximately 0.65, which is positioned at an upper left portion compared with the reference EL element. The color shift is small, and the color purity can be improved.

As described above, according to the arrangement of the present embodiment, one pixel can include two types of microcavity structures having the cavity lengths of 2720 A and 3800 A (i.e., mutually differentiated in the thickness by a difference of approximately 1100 A). The viewing angle dependence with respect to the green color light can be greatly improved (i.e., reduced).

The resonance conditions and the viewing angle dependence of the resonant wavelength can be expressed by the following formula.

$$\frac{2L\cos\theta'}{\lambda'} + \frac{\Phi}{2\pi} = m \quad (3)$$

$$\theta' = \sin^{-1}\{(\sin\theta)/n\} \quad \lambda' = \lambda + (\cos\theta - 1)\lambda$$

In the formula, L represents an above-described optical length L (=$\Sigma n_i d_i$), $\phi$ is a constant representing a phase shift caused by the reflection on the metallic material, m is an integer, and θ represents an angle (i.e., viewing angle).

The abscissa of FIG. 5 is the resonant waveform at the viewing angle 0°, while the ordinate of FIG. 5 shows the shift amount of a peak wavelength toward the short wavelength side at the viewing angle 60°. The cavity length D is 4500 A to 5500 A.

As apparent from FIG. 5, in the condition that the peak wavelength (i.e., the resonant wavelength) at the viewing angle 0° is approximately 450 nm, the shift amount of the peak wavelength at the viewing angle 60° is approximately 28 nm. Furthermore, in the condition where the peak wavelength at the viewing angle 0° is approximately 600 nm, the shift amount of the peak wavelength at the viewing angle 60° is approximately 60 nm.

In this manner, the waveform having a peak value at 600 nm at the viewing angle 0° decreases by 60 nm when shifting to the viewing angle of 60° and accordingly becomes a waveform having a peak value at 540 nm.

Accordingly, the interpolation for the green light of 550 nm can be performed based on the combination with the cavity length D of approximately 600 nm to approximately 700 nm (i.e., the cavity length D required to resonate the wavelength of approximately 600 nm to approximately 700 nm). The stepwise difference is approximately 1000 A (100 nm) to approximately 1300 A (130 nm), when m=1, from the above-described formula.

MC2720 and MC3800 have resonant wavelengths of 570 nm (m=1) and 510 nm (m=2), respectively, with respect to the light of 0°. Namely, according to the above-described example, the viewing angle dependence is small. To provide the microcavity structure for the green light, one pixel has two cavity lengths for obtaining the resonant peaks of 510 nm and 570 nm at the viewing angle of 0°.

Furthermore, the interpolation for the red light of 630 nm can be performed based on the combination with the cavity length D of approximately 700 nm to approximately 800 nm. The stepwise difference is approximately 1600 A, when m=1.

Furthermore, the interpolation for the blue light of 450 nm can be performed based on the combination with the cavity length D of approximately 480 nm to approximately 5800 nm. The stepwise difference is approximately 1000 A, when m=1.

Although the stepwise difference varies depending on a selected value of m, it is desirable to set the stepwise difference of 2000 A or less, considering the coverage (drape) of the stepwise difference. More specifically, one pixel can include a first region (e.g., the above-described example MC3800A) and a second region (e.g., the above-described example MC2700A) which are differentiated in cavity length. In this case, the cavity length D of the first region and the cavity length D of the second region should be determined considering their target resonant wavelengths, original light emission spectrum, or filter characteristics if a color filter is combined. A preferable difference of the cavity length (i.e., the stepwise difference) is 200 nm (2000 A) or less.

With the above-described settings, for example, even in the above-described case where the thickness of the transparent electrode is partly changed to form the first and second regions, it becomes possible to prevent the stepwise difference formed in the transparent electrode from cutting an upper layer of the electrode.

For example, when the thickness of the electron transporting layer is increased, the drive voltage will increase. To suppress the increase in the voltage, the thickness of the electron transporting layer is usually set to be 3000 A or less. For the purpose of preventing the electron transporting layer from being cut by the stepwise difference, a desirable stepwise difference is 200 nm or less.

As described above, setting plural cavity lengths D in one pixel region for obtaining a particular color can improve the viewing angle dependence and increase the color purity. In this case, the plural cavity lengths D can be set in the following manner.

For example, the cavity length D in the first region can be set to a predetermined thickness that can equalize the target resonant wavelength with a peak wavelength at the viewing angle 0°. The cavity length D (required for compensation) in the second region can be set to another thickness that can equalize the target resonant wavelength with a peak wavelength at another viewing angle (e.g., 60°). One of the selected cavity lengths D can be longer or shorter than the other.

Furthermore, according to the above-described embodiment, one pixel includes two types of regions differentiated in the cavity length. However, the differentiated regions are not limited to only two types and accordingly one pixel can include three or more types of differentiated regions.

In the present embodiment, when the organic layer constituting a compensating microcavity is thin, an area ratio of the thick region of the organic layer 34 to the thin region constituting the compensating microcavity can be differentiated for each color (RGB) of the light emitted from the pixel.

Figure 6:
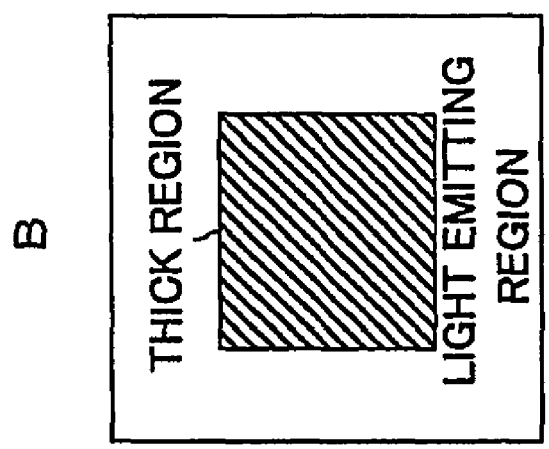
FIG. 6 is a view schematically showing the formation of a thick reflection film portion differentiated in each of R, G, and B light emitting pixels.
Figure 6:
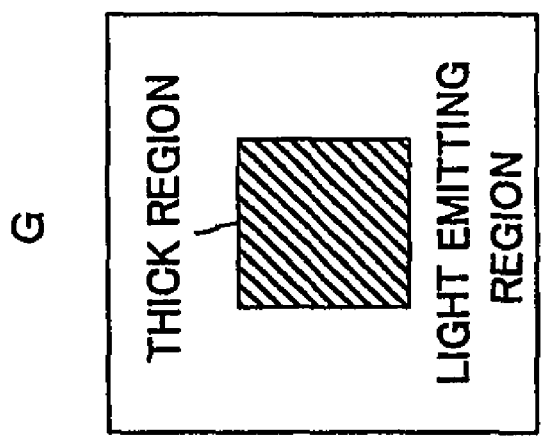
Figure 6:
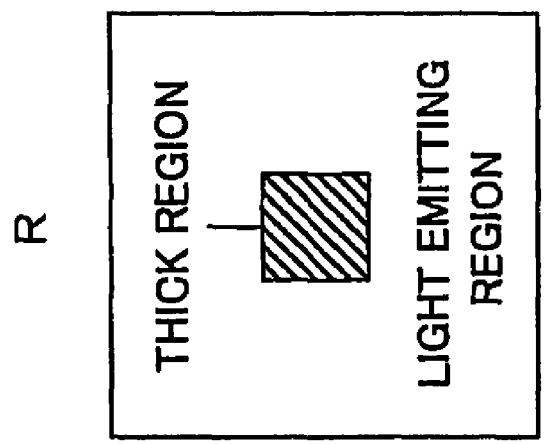

More specifically, as schematically shown in FIG. 6, the area percentage of the thick region of the organic layer 34 relative to the entire light emitting region can be set to be smallest in the R light emitting pixel, medium in the G light emitting pixel, and B light emitting pixel.

The above settings are based on the fact that the viewing angle dependence becomes larger at long wavelengths, as confirmed by the characteristics of the microcavity structure that enhances a specific wavelength.

In this manner, setting the area percentage of the thick region of the organic layer 34 to be smallest in the R light emitting pixel, medium in the G light emitting pixel, and largest in the B light emitting pixel can bring about substantially the same effects for each of R, G, and B light emitting pixels in enhancing the light of a specific wavelength as well as in improving the viewing angle dependence. Furthermore, the thickness of the transparent electrode 26 can be changed instead of changing the thickness of the organic layer 34.

Third Embodiment

Figure 7:
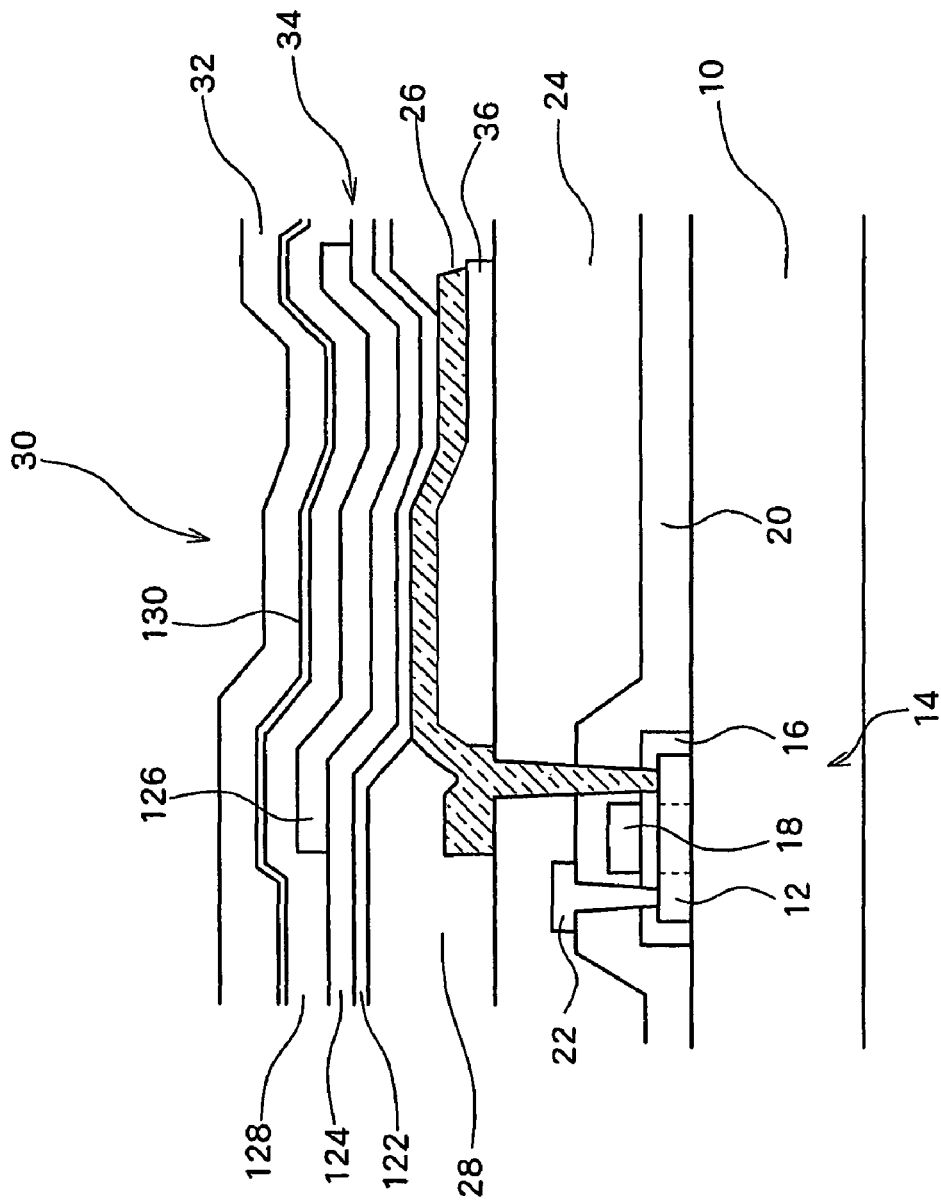
FIG. 7 is a cross-sectional view showing an essential structure of a pixel in accordance with a third embodiment of the present invention.

FIG. 7 shows an essential structure of a pixel in accordance with a third embodiment of the present invention. The lower reflection film 36 of the third embodiment covers the entire surface of the light emitting region. The lower reflection film 36 of the third embodiment is constituted by the above-described multilayered dielectric films. The thickness of the lower reflection film 36 is locally differentiated in each pixel (i.e., in one light emitting region).

More specifically, a thick region of the lower reflection film 36 can be constituted by a larger number of dielectric film layers while a thin region of the lower reflection film 36 can be constituted by a smaller number of dielectric film layers. According to the example shown in FIG. 7, the lower reflection film 36 is thick in a left part of the light emitting region and thin in a right part of the light emitting region.

The characteristics of the microcavity structure can be determined according to the distance (i.e., cavity length) between the upper reflection film and the lower reflection film. When the thickness of the lower reflection film 36 is partly changed as described in the present embodiment, the microcavity effect of enhancing the light of a specific wavelength is large in the thick region.

Accordingly, in the present embodiment, one pixel includes a region where the microcavity effect of enhancing the light of a specific wavelength is large and another region where the microcavity effect of enhancing the light of a specific wavelength is small. Thus, the present embodiment can adequately enhance the light of a specific wavelength and improve the viewing angle dependence.

Similar to the above-described embodiment, in the present embodiment, the area ratio of the thick region and the thin region of the lower reflection film 36 can be differentiated depending on the color (RGB) of the light emitted from the pixel. As schematically shown in FIG. 6, the area percentage of the thick region of the lower reflection film 36 relative to the entire light emitting region can be set to be smallest in the R light emitting pixel, medium in the G light emitting pixel, and largest in the B light emitting pixel. This arrangement can bring about substantially the same effects for each of R, G, and B light emitting pixels in enhancing the light of a specific wavelength and improving the viewing angle dependence.

Other Embodiments

Figure 8:
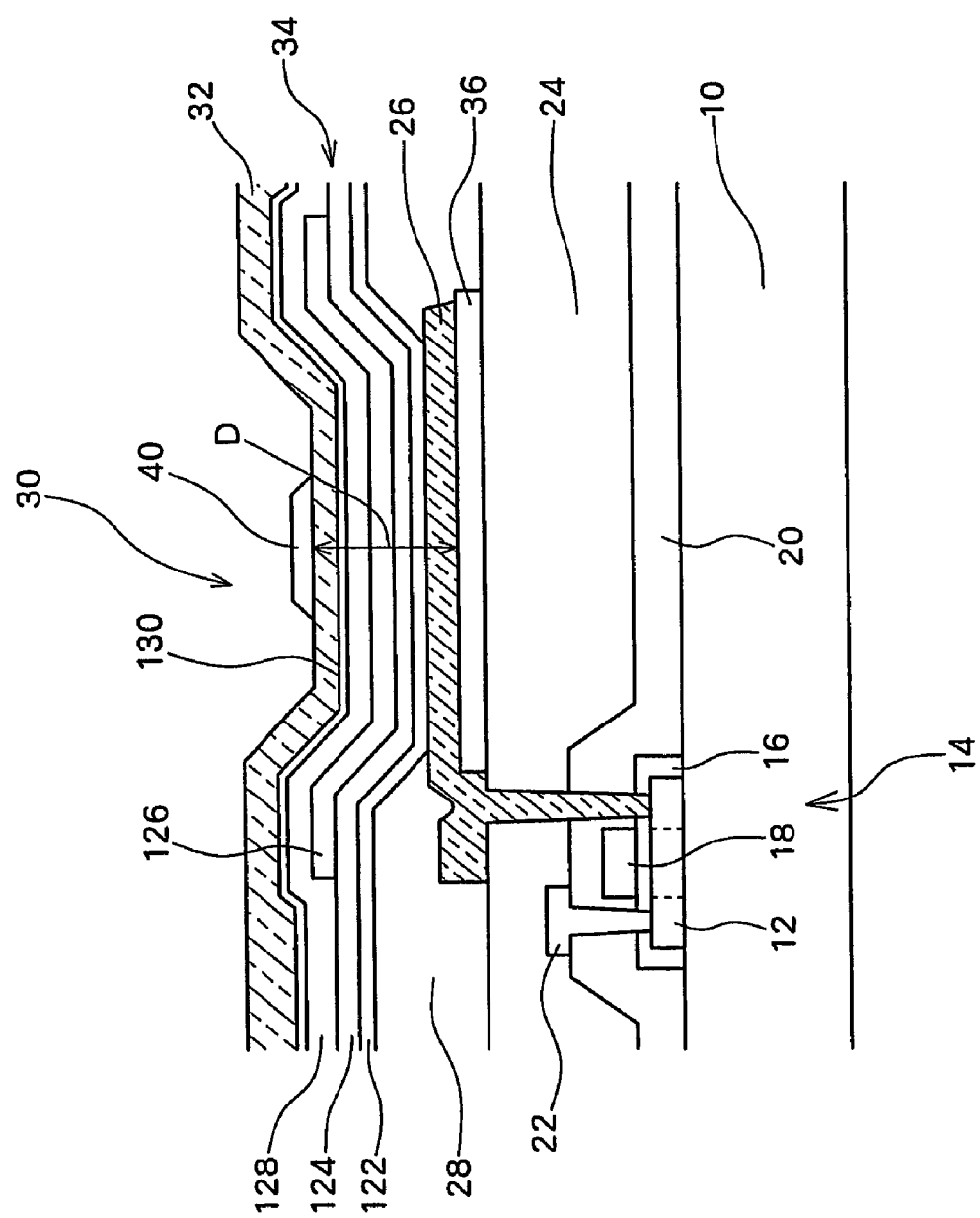
FIG. 8 is a cross-sectional view showing an essential structure of a pixel in accordance with other embodiment of the present invention.
Figure 9:
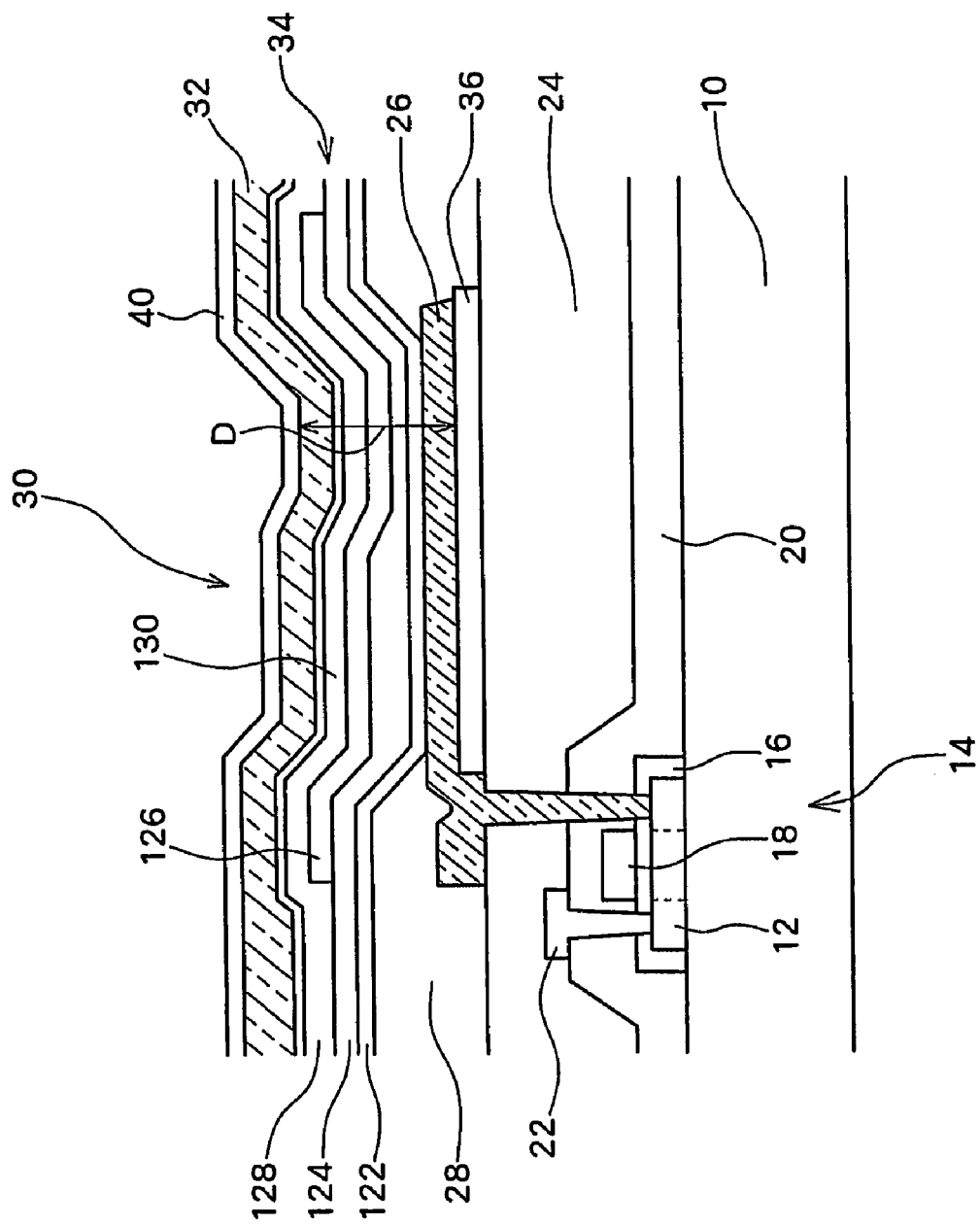
FIG. 9 is a cross-sectional view showing an essential structure of a pixel in accordance with other embodiment of the present invention.
Figure 10:
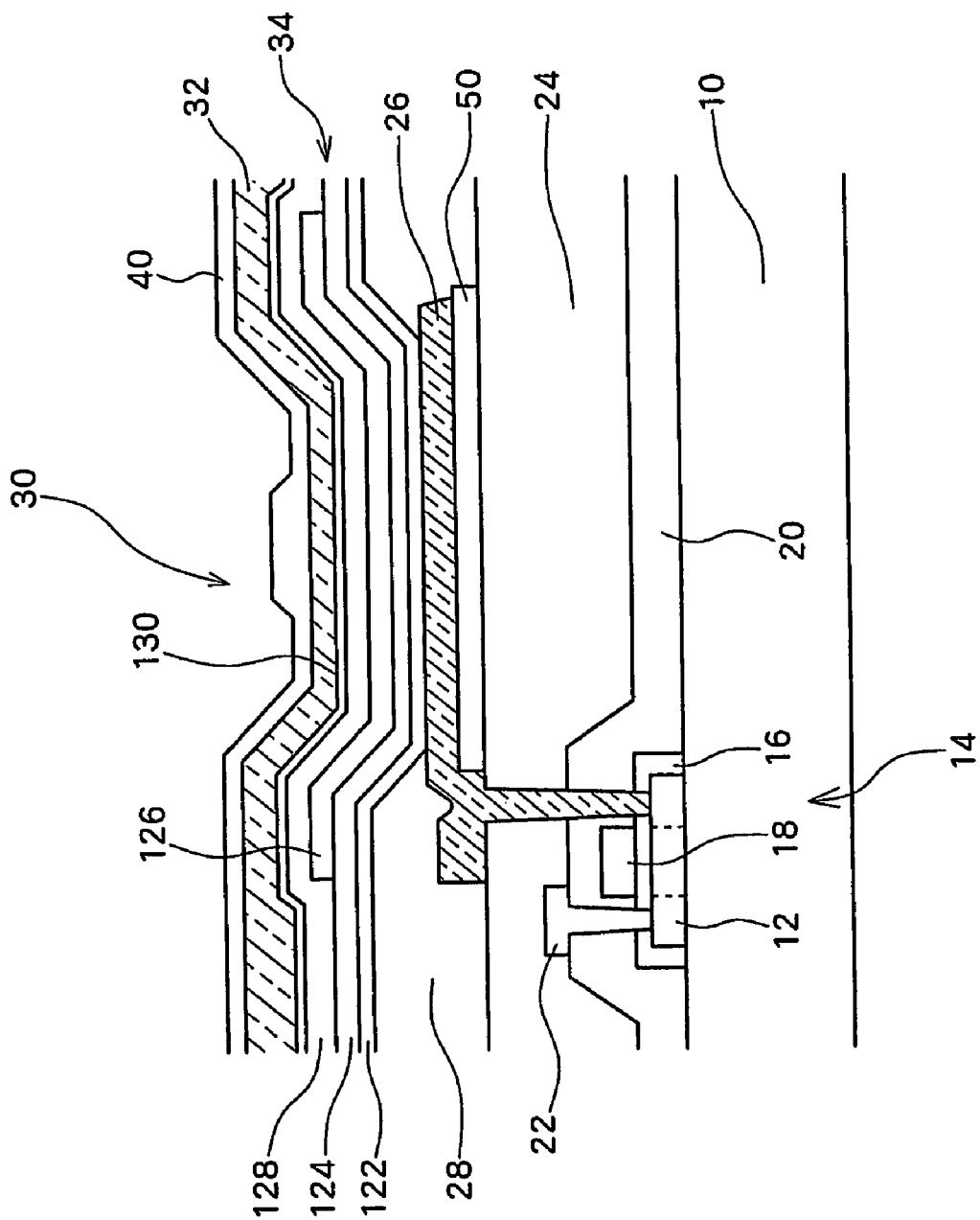
FIG. 10 is a cross-sectional view showing an essential structure of a pixel in accordance with other embodiment of the present invention.

FIGS. 8 to 10 show other embodiments of the present invention, each belonging to the top emission type characterized in that the light can penetrate in the direction opposite to the glass substrate 10. The lower reflection film 36, disposed between the transparent electrode 26 functioning as an anode and the first flattening film 24, is a reflection film, not a semi-transmissive film. Accordingly, the light generated from the organic layer 34 cannot penetrate the glass substrate 10. On the other hand, the counter electrode 32 is made of a transparent conductor, such as ITO or IZO. The semi-transmissive film 40 is provided on the counter electrode 32. Accordingly, the microcavity structure is present between the lower reflection film 36 and the semi-transmissive film 40.

According to the embodiment shown in FIG. 8, the semi-transmissive film 40 is partly provided in the light emitting region on the counter electrode 32. In the region where the semi-transmissive film 40 is present, the microcavity structure can be formed so as to enhance the light of a specific wavelength. In the region where the semi-transmissive film 40 is not present, the light can advance straight in the upward direction. Similar to the arrangement shown in FIG. 1, this arrangement can enhance the light of a specific wavelength and can also improve the viewing angle dependence.

According to the embodiment shown in FIG. 9, the semi-transmissive film 40 is provided on the entire surface of the counter electrode 32. The hole transporting layer 124 is partly thickened and accordingly can bring about substantially the same functions identical with those brought by the example shown in FIG. 3, although the direction of light emission is opposite. The cavity length is adjustable by changing the thickness of at lest one of the layers constituting the organic layer 34. The thickness of the transparent electrode 26 or the counter electrode 32 can be also changed.

According to the embodiment shown in FIG. 10, the semi-transmissive film 40 is provided on the entire surface of the counter electrode 32 but is partly thickened. Accordingly, the embodiment shown in FIG. 10 can bring about substantially the same functions as those brought about by the example shown in FIG. 7, although the direction of light emission is opposite.

In the embodiments shown in FIGS. 8 to 10,
(i) the area ratio of a region where the semi-transmissive film 40 is present and another region where the semi-transmissive film 40 is not present;
(ii) the area ratio of regions of the organic layer 34 differentiated in thickness; and
(iii) the area ratio of a thick region and a thin region of the semi-transmissive film
can be changed or adjusted for each of the R, G, and B light emitting pixels.

The differences in respective colors caused by the microcavity structure can be reduced, and the viewing angle dependence can be effectively improved. The area ratio can be set as shown in FIGS. 2 and 6, and the position, size, and total number can be arbitrarily selected.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

What is claimed is:

1. An organic electroluminescent (EL) panel comprising:
a first pixel; and
an organic EL element disposed in the first pixel and selected from the group consisting of a red (R) light emitting organic EL element, a green (G) light emitting organic EL element, and a blue (B) light emitting organic EL element, wherein
the organic EL element of the pixel has a multilayered structure including a luminous element layer having at least a light emitting function, disposed between a reflection film and a semi-transmissive film which are opposed to each other,
the organic EL has a microcavity structure having a cavity length, representing an interlayer distance between the reflection film and the semi-transmissive film, which can enhance the light of a predetermined wavelength, and
a first region within the organic EL element where the cavity length is a first length and a second region within the same organic EL element where the cavity length is a second length are included in the first pixel, and
an area ratio of the region where the cavity length is the first length and the region where the cavity length is the second length is differentiated depending on the color of the light emitted from the first pixel; and
the organic EL element comprises:
a hole transporting layer;
wherein a thickness of the hole transporting layer in the region where the cavity length is the first length is thicker than a thickness of the hole transporting layer in the region where the cavity length is the second length.

2. The organic EL panel according to claim 1, wherein the first pixel is a R light emitting pixel having an R light emitting organic EL element; and
the organic EL panel further comprises:
second pixel that is a G light emitting pixel having a G light emitting organic EL element; and
a third pixel that is a B light emitting pixel having a B light emitting organic EL element;
wherein the area ratio of the region where the cavity length is the first length and the region where the cavity length is the second length is smallest in the R light emitting pixel, medium in the G light emitting pixel, and largest in the B light emitting pixel.

3. The organic EL panel according to claim 1, wherein light generated from the organic EL element is emitted to the outside from a substrate side above which the organic EL element is formed.

4. The organic EL panel according to claim 1, wherein light generated from the organic EL element is emitted to the outside from a side opposite to a substrate above which the organic EL element is formed.

5. The organic EL panel according to claim 1, wherein the luminous element layer in the region where the cavity length is the first length is formed to be thicker than the luminous element layer in the region where the cavity length is the second length.

* * * * *